United States Patent
Shah et al.

(10) Patent No.: US 11,763,905 B2
(45) Date of Patent: Sep. 19, 2023

(54) STORAGE SYSTEM AND METHOD FOR DATA PROTECTION DURING POWER LOSS

(71) Applicant: Western Digital Technologies, Inc., San Jose, CA (US)

(72) Inventors: Grishma Shah, Milpitas, CA (US); Sergey Anatolievich Gorobets, Edinburgh (GB); Daniel Tuers, Kapaa, HI (US)

(73) Assignee: Western Digital Technologies, Inc., San Jose, CA (US)

( * ) Notice: Subject to any disclaimer, the term of this patent is extended or adjusted under 35 U.S.C. 154(b) by 152 days.

(21) Appl. No.: 17/553,024

(22) Filed: Dec. 16, 2021

(65) Prior Publication Data

US 2023/0197176 A1 Jun. 22, 2023

(51) Int. Cl.
*G11C 16/26* (2006.01)
*G11C 16/34* (2006.01)
*G11C 29/02* (2006.01)
*G11C 16/10* (2006.01)
*G11C 16/08* (2006.01)

(52) U.S. Cl.
CPC .......... *G11C 16/3481* (2013.01); *G11C 16/08* (2013.01); *G11C 16/102* (2013.01); *G11C 16/26* (2013.01); *G11C 16/3459* (2013.01); *G11C 29/021* (2013.01)

(58) Field of Classification Search
CPC ... G11C 16/3481; G11C 16/08; G11C 16/102; G11C 16/26; G11C 16/3459; G11C 29/021
See application file for complete search history.

(56) References Cited

U.S. PATENT DOCUMENTS

| | | |
|---|---|---|
| 7,345,928 B2 | 3/2008 | Li |
| 8,132,045 B2 | 3/2012 | Avila et al. |
| 9,053,810 B2 | 6/2015 | Dutta et al. |
| 9,740,419 B2 | 8/2017 | Wakchaure et al. |
| 10,748,624 B2 | 8/2020 | Bonitz |
| 2014/0082406 A1 | 3/2014 | Erez |
| 2014/0281683 A1 | 9/2014 | Dusija et al. |
| 2022/0392555 A1* | 12/2022 | Mizukoshi ......... G11C 16/3481 |

* cited by examiner

*Primary Examiner* — Xiaochun L Chen
(74) *Attorney, Agent, or Firm* — Crowell & Moring LLP

(57) ABSTRACT

Upon detecting power loss during the process of programming multi-level cell (MLC) memory in a storage system, the storage system takes steps to prevent data loss. In one example, the controller sends a graceful shutdown command to the memory, in response to which the memory aborts the ongoing programming operation and stores data from data latches associated with unprogrammed memory cells in single-level cell (SLC) memory. The memory can also store data from programmed memory cells in the SLC memory. The data to be programmed in the MLC memory can be reconstructed prior to powering down the storage system or after the storage system is powered back up. The reconstructed data can then be programmed in the MLC memory.

19 Claims, 18 Drawing Sheets

| | B0X4 (S2S) | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|---|
| DL4 (Top) | (S1', S3', S7', S11', S14') | 1 | 0 | 0 | 1 | 1 | 1 | 1 | 0 | 0 | 0 | 0 | 1 | 1 | 1 | 0 | 0 |
| DL3 (Upper) | (S2', S5', S9', S13', S15') | 1 | 1 | 0 | 0 | 0 | 1 | 1 | 1 | 1 | 0 | 0 | 0 | 0 | 1 | 1 | 0 |
| DL2 (Middle) | (S4', S12') | 1 | 1 | 1 | 1 | 0 | 0 | 0 | 0 | 0 | 0 | 0 | 0 | 1 | 1 | 1 | 1 |
| DL1 (Lower) | (S6', S8', S10') | 1 | 1 | 1 | 1 | 1 | 1 | 0 | 0 | 1 | 1 | 0 | 0 | 0 | 0 | 0 | 0 |

FIG. 9

| BBX4 (3256) | S0 or Successfully Programmed Cell | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| DL4 (Top) (S1', S3', S7', S11', S14') | 1 | 0 | 0 | 1 | 1 | 1 | 1 | 0 | 0 | 0 | 0 | 1 | 1 | 1 | 0 | 0 |
| DL3 (Upper) (S2', S5', S9', S13', S15') | 1 | 1 | 0 | 0 | 0 | 1 | 1 | 1 | 1 | 0 | 0 | 0 | 0 | 1 | 1 | 0 |
| DL2 (Middle) (S4', S12') | 1 | 1 | 1 | 1 | 0 | 0 | 0 | 0 | 0 | 0 | 0 | 0 | 1 | 1 | 1 | 1 |
| DL1 (Lower) (S6', S8', S10') | 1 | 1 | 1 | 1 | 1 | 1 | 0 | 0 | 1 | 1 | 0 | 0 | 0 | 0 | 0 | 0 |

FIG. 10

| Programmed Flag (PF) | uLP (SLC) | QLC LP | Recovered LP (before ECC) |
|---|---|---|---|
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

FIG. 13

STORAGE SYSTEM AND METHOD FOR DATA PROTECTION DURING POWER LOSS

BACKGROUND

Data loss can occur if there is a power loss while a storage system is programming its non-volatile memory. To ensure data reliability in such a situation, the storage system can employ a power loss protection system to ensure certain actions are taken to protect the data. For example, the storage system can maintain a copy of the data in volatile memory until the data is successfully programmed in multi-level cell (MLC) blocks in the non-volatile memory. Upon detecting a power loss event, any data in the volatile memory that was not successfully programmed to the MLC blocks can be written to blocks in the non-volatile memory that can be programmed more quickly (e.g., single-level cell (SLC) blocks). As another example, all of the data can be first written to the SLC blocks before attempting to write the data to the MLC blocks. That way, if there is a power loss, the data is already stored in the SLC blocks.

BRIEF DESCRIPTION OF THE DRAWINGS

FIG. 9 is an illustration of a data latch assignment and reconstruction process of an embodiment.

FIG. 10 is an illustration of a data latch assignment and reconstruction process of an embodiment in which one memory cell was successfully programmed.

FIG. 13 is a chart illustrating the use of a program flag of an embodiment.

DETAILED DESCRIPTION

The following embodiments generally relate to a storage system and method for data protection during power loss. In one embodiment, a storage system is presented comprising a memory and a controller. The memory comprises data latches and a non-volatile memory array comprising single-level cell (SLC) memory and multi-level cell (MLC) memory. The controller is configured to send a command to the memory in response to detection of power loss; wherein in response to receiving the command, the memory is configured to abort an ongoing programming operation to program data, from the data latches, in the MLC memory, wherein after aborting the ongoing programming operation, some, but not all, memory cells in the MLC memory are successfully programmed; and wherein the controller is further configured to: reconstruct the data that was to be programmed in the MLC memory from the data latches that correspond to memory cells in the MLC memory that were not successfully programmed and from the memory cells in the MLC memory that were successfully programmed; and program the reconstructed data in the SLC memory prior to powering down the storage system.

In another embodiment, a method is provided comprising sending a command from the controller to the memory in response to detection of power loss; in response to the memory receiving the command, aborting an ongoing programming operation to program data, from the data latches, in the MLC memory, wherein after aborting the ongoing programming operation, some, but not all, memory cells in the MLC memory are successfully programmed; and prior to powering down the storage system, programming, in the SLC memory, data from the data latches that correspond to memory cells in the MLC memory that were not successfully programmed and data from the memory cells in the MLC memory were successfully programmed.

In yet another embodiment, a storage system is provided comprising a memory comprising data latches and a non-volatile memory array comprising single-level cell (SLC) memory and multi-level cell (MLC) memory; means for, in response to receiving a command generated in response to detection of power loss, aborting an ongoing programming operation to program data, from the data latches, in the MLC memory, wherein after aborting the ongoing programming operation, some, but not all, memory cells in the MLC memory are successfully programmed; means for storing, in the SLC memory prior to powering down the storage system, data from the data latches that correspond to memory cells in the MLC memory that were not successfully programmed; and means for, after powering up the storage system, reconstructing the data that was to be programmed in the MLC memory from the data stored in the SLC memory and from the memory cells in the MLC memory that were successfully programmed.

Other embodiments are provided, and each of these embodiments can be used alone or in combination.

Figure 1A:
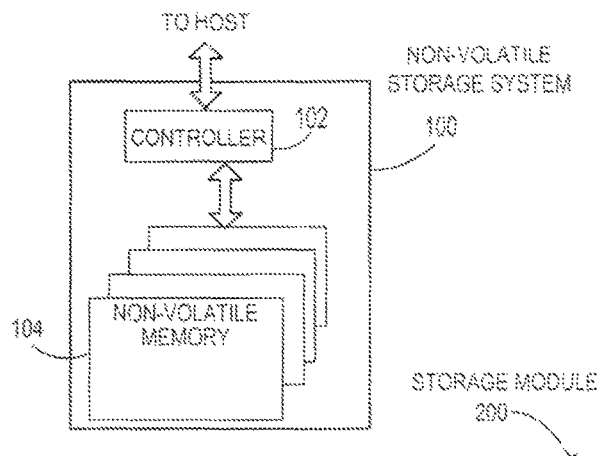
FIG. 1A is a block diagram of a non-volatile storage system of an embodiment.
Figure 1B:
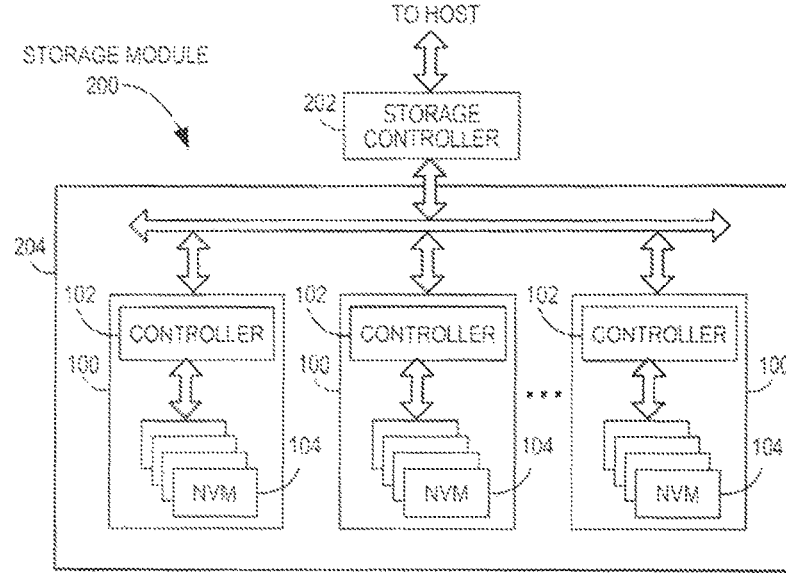
FIG. 1B is a block diagram illustrating a storage module of an embodiment.
Figure 1C:
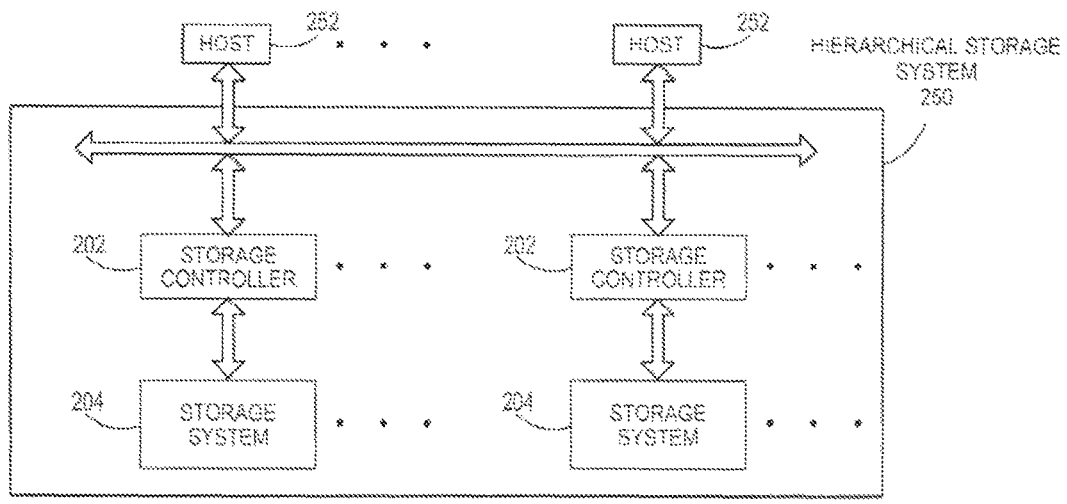
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
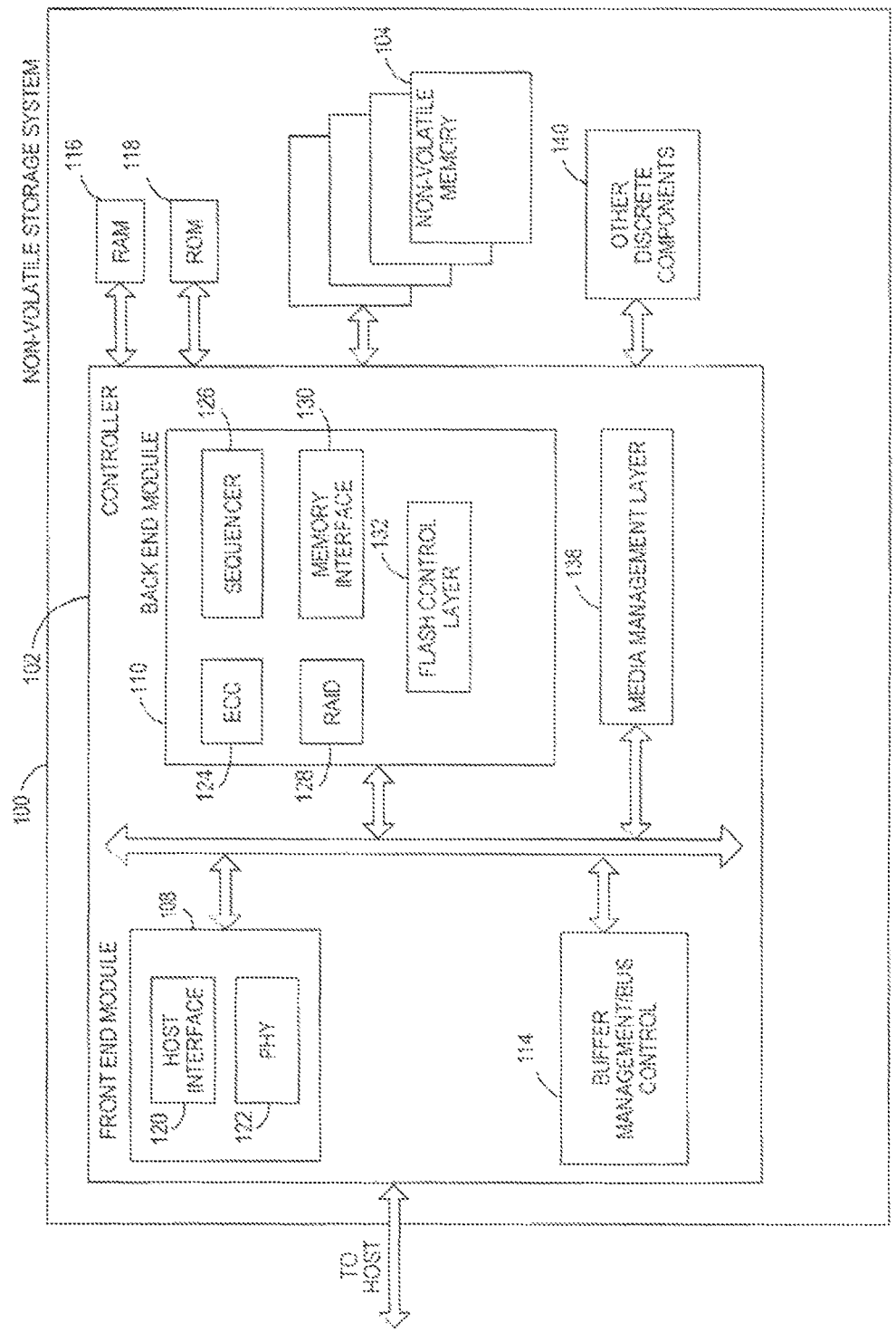
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
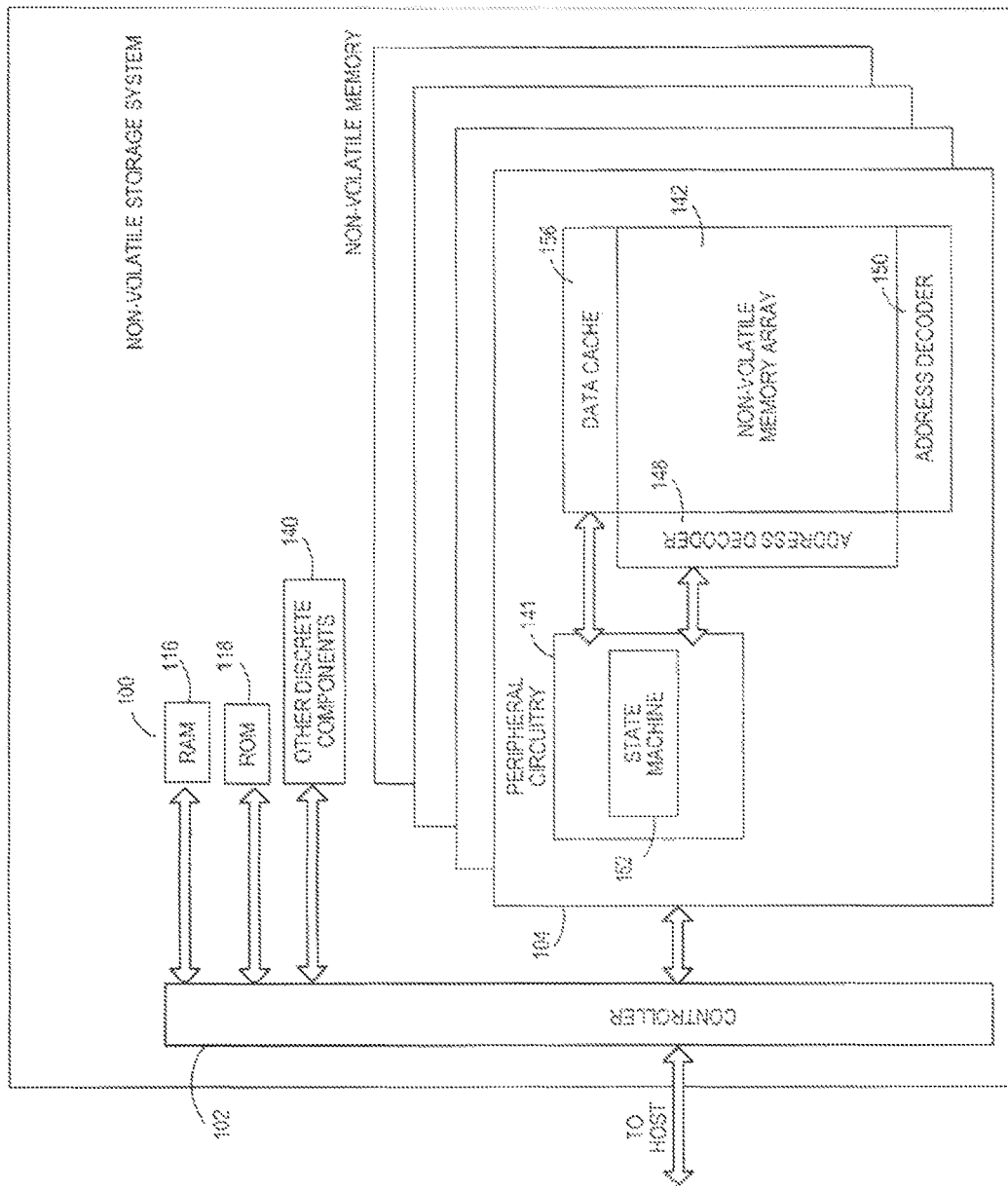
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 2C:
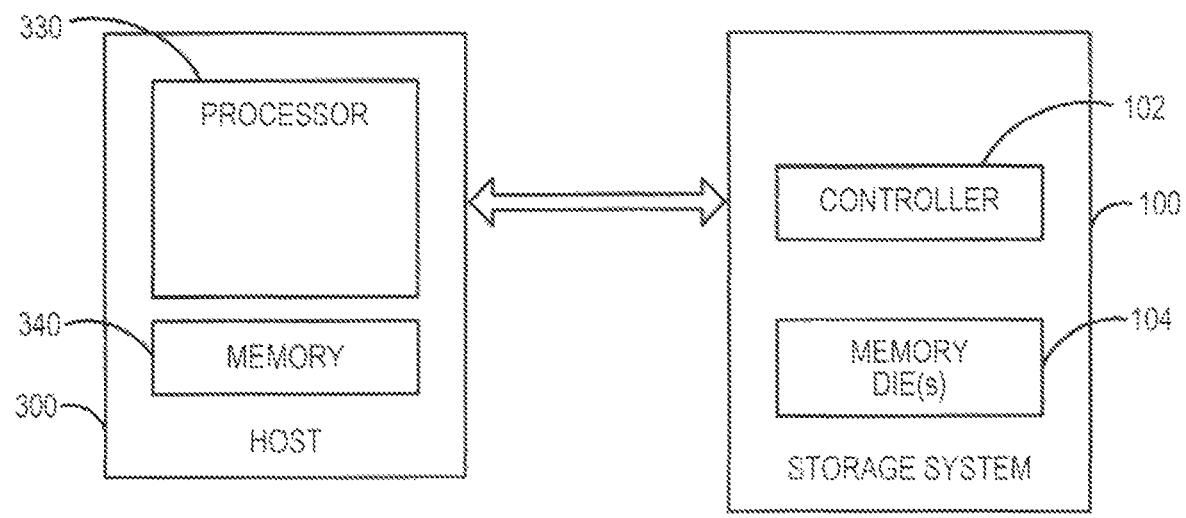
FIG. 2C is a block diagram of a host and a storage system of an embodiment.

Turning again to the drawings, FIG. 2C is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 2C, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

Figure 3:
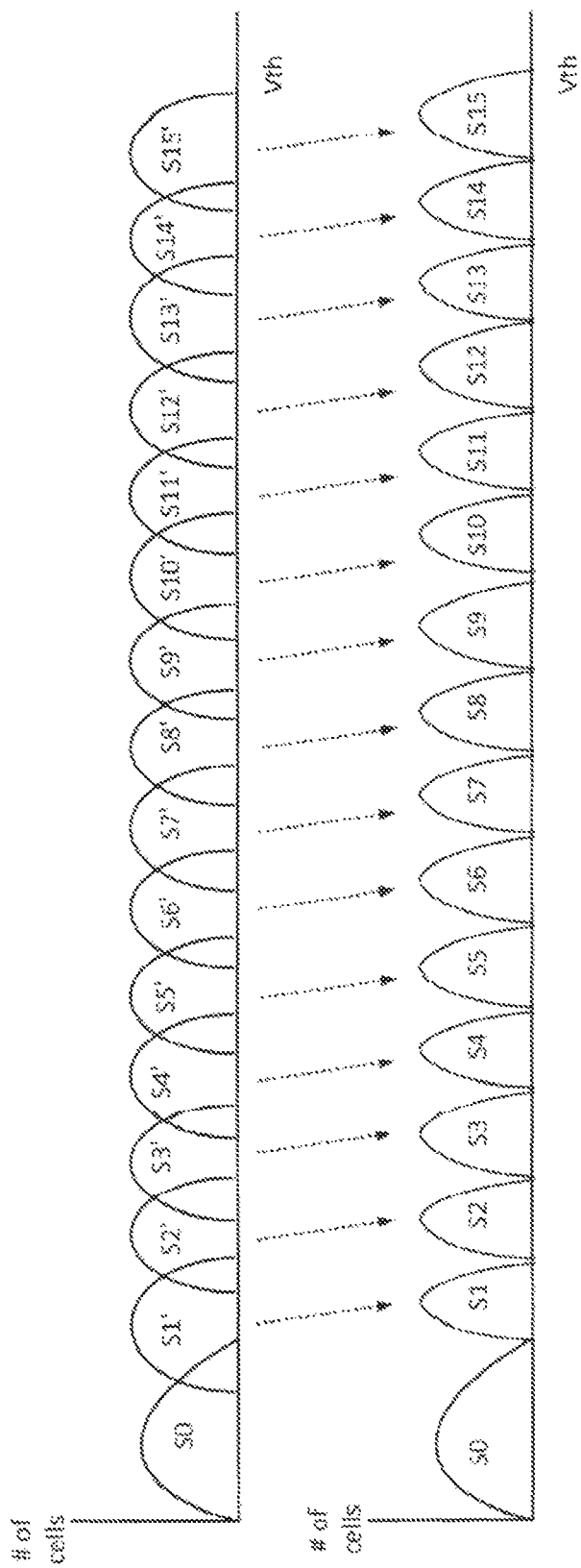
FIG. 3 is a diagram illustrating a foggy-fine programming operation of an embodiment.

The memory 104 can be programmed in any suitable way. For example, a two-pass programming technique known as "foggy-fine" can be used to program one of four states in a memory cell. FIG. 3 illustrates an example of foggy-fine programming of a group of QLC memory cells using sixteen distributions corresponding to sixteen data states. All memory cells may be in an erased distribution (e.g., distribution S0) prior to foggy programming. Foggy programming programs memory cells to the first distributions S1' to S15' shown on the top of FIG. 3. Fine programming subsequently programs the memory cells to the second distributions S1 to S15 shown on the bottom of FIG. 3. There may be some time between these two program operations, and one or more other groups of memory cells may be programmed during that time. It will be understood that memory cells of a given first distribution are subsequently further programmed to a corresponding second distribution without erasing memory cells between so that fine programming does not start from the erased distribution. For example, memory cells that are programmed to the S1' distribution in a foggy program operation are subsequently further programmed to the S1 distribution in a fine program operation, memory cells that are programmed to the S2' distribution in a foggy program operation are subsequently further programmed to the S2 distribution in a fine program operation, memory cells that are programmed to the S3' distribution in a foggy program operation are subsequently further programmed to the S3 distribution in a fine program operation, and so on.

First distributions S1' to S15' are generally wider than second distributions S1-S15, and there is significant overlap between adjacent distributions (e.g., distribution S1' overlaps distribution S2', distribution S2' overlaps distribution S3', and so on), It should be noted while the bottom graph in FIG. 3 does not show overlap in the distributions, there may be some overlap. However, because such overlap creates a relatively-small number of errors that are easily correctable with ECC, the overlap is not shown in FIG. 3.

As mentioned above, storage systems (e.g., used with enterprise applications) may be required to ensure data reliability across power cycles. That is, any data that is transferred by the host to the storage system may be required to be readable. A problem can be presented when a power loss occurs (e.g., a power interruption from the host) during the process of programming the non-volatile memory. In general, data received from the host may first be stored in volatile memory in the storage system prior to the data being programmed in the non-volatile memory. During the program operation, the data is transferred from the volatile memory to data latches in the non-volatile memory. Because the latches are volatile, the data stored in the latches is lost when power (e.g., NAND Vcc) is removed from the non-volatile memory. Depending upon the timing of the power loss, the wordline that was being programmed during the power loss event may be unreadable. Further, the original data in the volatile memory will also be lost when power is removed from the storage system, if the data is still stored there. Some storage systems erase the data from the volatile memory after the data is transferred to the data latches. For example, TRAM buffers can be made available for the next host command as soon as possible. Often, they are assumed "free" as soon as the data is in the latches in the memory die.

Several mechanisms can be used to protect against such data loss. For example, the storage system can be equipped with a power loss protection (PLP) system with a set of capacitors that provides power to the storage system for a short period of time after power is removed by the host. Consider a storage system that maintains data in the volatile memory (e.g., a DRAM or SRAM cache) after the data is sent to the latches in the non-volatile memory and until the data is successfully programmed in the non-volatile memory. In this example, the data is being programming in MLC memory (e.g., TLC or QLC memory) in the non-volatile memory, which requires a longer programming time than SLC memory. Upon detecting an upcoming power loss event (e.g., receiving a PLP signal from the host, the controller of the storage system terminates all on-going memory program operations in the non-volatile memory using a reset command. All the data held in the volatile memory (e.g., SRAM or DRAM, not the latches in the memory die) that was not successfully programmed to MLC memory is then written to blocks in the SLC memory before power loss (e.g., before the capacitors can no longer keep the storage system powered). The cost associated with the long data route associated with transferring data all the way from DRAM or SRAM to NAND for SLC programming can make this option less attractive or even useless. Another issue is that if the data needs to be buffered in DRAM, that would require an additional data transfer from the controller to DRAM. This extra transfer can make the DRAM channel the main write performance bottleneck and/or can increase the storage system's power consumption and reduce overall performance in power-limited use cases. Further, this approach requires a relatively-large volatile memory to hold all the data that is yet to be programmed, as well as any previously-written wordline that may be corrupted by a power loss event that occurs while programming the next set of pages on the same wordline. Accordingly, this approach has the disadvantage of high volatile memory cost, especially for lower-end enterprise-grade storage systems that usually cannot afford a large volatile memory.

Figure 4:
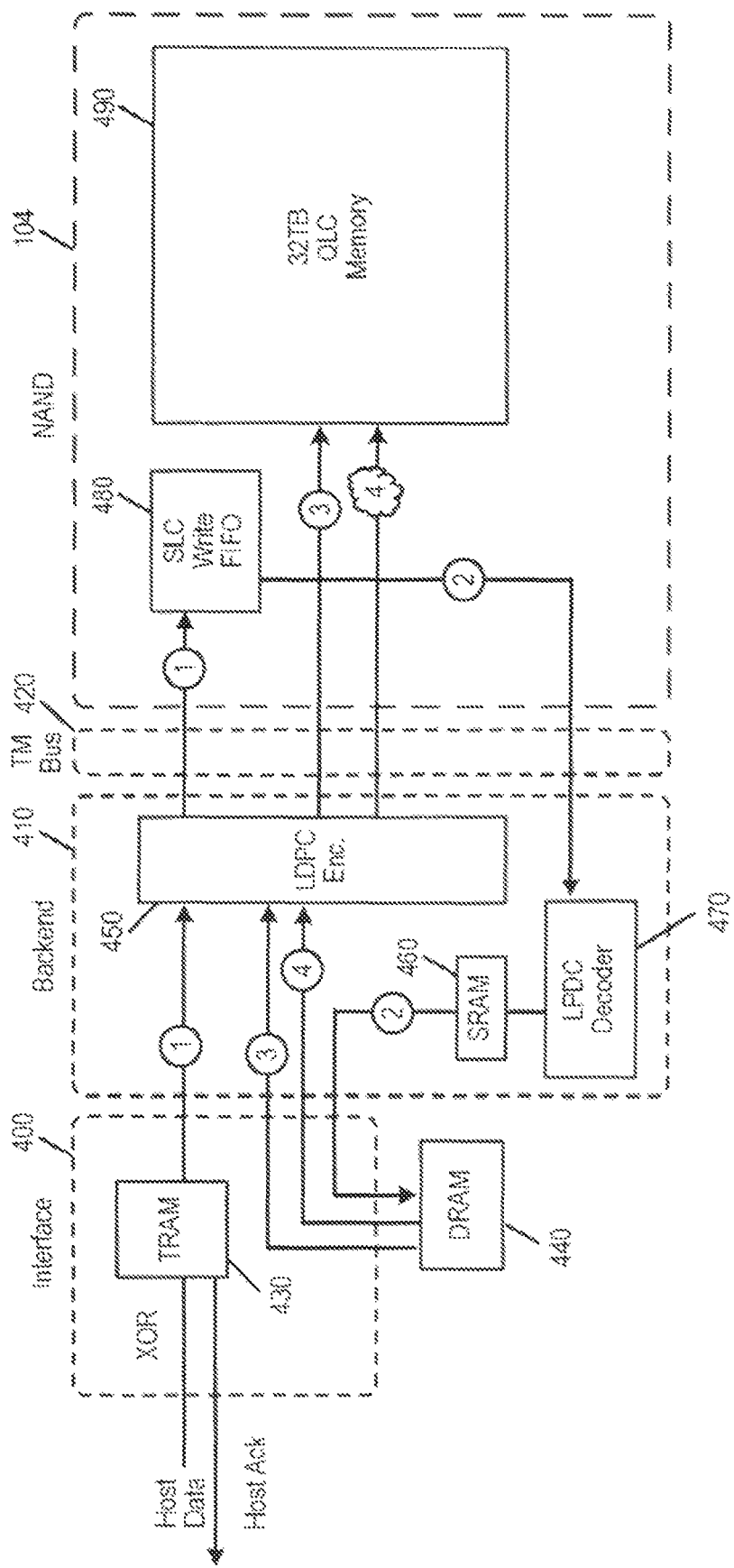
FIG. 4 is a block diagram of a storage system of an embodiment showing a data path for providing data protection during power loss.

Yet another approach is to program all the data received from the host into the SLC blocks first and then copy the data to the MLC blocks. This approach is illustrated in FIG. 4. As shown in FIG. 4, the storage system 100 in this example comprises an interface 400, a backend module 410, a toggle mode (TM) bus 420, and the non-volatile memory 104 (here, NAND). The interface 400 comprises transfer RAM (TRAM) 430, the backend module 410 comprises a low-density parity check (LDPC) encoder 450, SRAM 460, and an LDPC decoder 470). The non-volatile memory 104 comprises SLC memory 480 and MLC (here, QLC) memory 490. The storage system 100 also comprises DRAM 440.

In operation, parity is generated from the data received from the host 300 (e.g., the data is XORed), stored in the TRAM 430 (which triggers an acknowledgement to the host 300), encoded by the LDPC encoder 450, and stored in the SLC memory 480 (Data Path 1). In this process, the storage system 100 can wait for the SLC memory 480 to have full zones available and trigger a fold (i.e., SLC to QLC copy) for all memory dies. Next, the data is read from the SLC memory 480, decoded by the LPDC decoder 470, stored in the SRAM 460, and then stored in the DRAM 440 (Data Path 2). The data is then read from the DRAM 440, encoded by the LDPC encoder 450, and programmed into the QLC memory 490 in foggy mode (Data Path 3). Then, the data is read from the DRAM 440, encoded by the LDPC encoder 450, and programmed into the QLC memory 490 in fine mode (Data Path 4).

Because the data is stored in the SLC memory 480 relatively quickly, the data is protected against a power loss that may occur while programming the QLC memory 490. That is, if a power loss occurs while programming the QLC memory 490, the data can be read from the SLC memory 480 and programmed into the QLC memory 490 when power is later restored. Further, because programming data in SLC is significantly faster and does not require more than one page to be programmed per wordline, the amount of data to be held in the volatile memory for power loss protection is smaller. Also, the data in the volatile memory can be evicted quickly due to the short amount of time needed for SLC programming. In this case, the storage system 100 uses its back-up capacitors' energy to complete the ongoing SLC programming operation and save other important data from SRAM, which require relatively-little backup energy.

However, there are disadvantages to this approach. For example, this approach requires a higher block budget, which can result in lower yield and higher cost. Also, high SLC endurance may be required to accommodate the extra SLC writes. Further, the use of this approach may result in a reduction in overall performance due to frequent movement of data. More specifically, this approach may have the disadvantage of writing each set of data twice to the non-volatile memory, which can cause a two-to-four-times faster wear-out of SLC blocks, require a significantly-larger number of SLC blocks, cause significantly-slower system performance, cause significantly-higher power consumption due to heavy data movement, and cause problematic thermal behavior of the storage system. The data movement across the TM bus (four times transfer amplification) or DRAM bus (three times transfer amplification) is the most-likely bottleneck in this case.

The following embodiments provide various techniques for data protection during power loss that avoids the disadvantages discussed above. These embodiments can also bring significant benefits in terms of product cost, product performance, and power. For example, these embodiments can reduce the wear-out of SLC blocks, thereby reducing the SLC endurance requirement by two-to-four times. These embodiments can also help reduce the controller cost by eliminating the need for extra RAM to hold data until it is successfully programmed in the memory 104. Further, these embodiments can allow for power reduction by reducing the number of times each page of data is written to memory 104.

Figure 5:
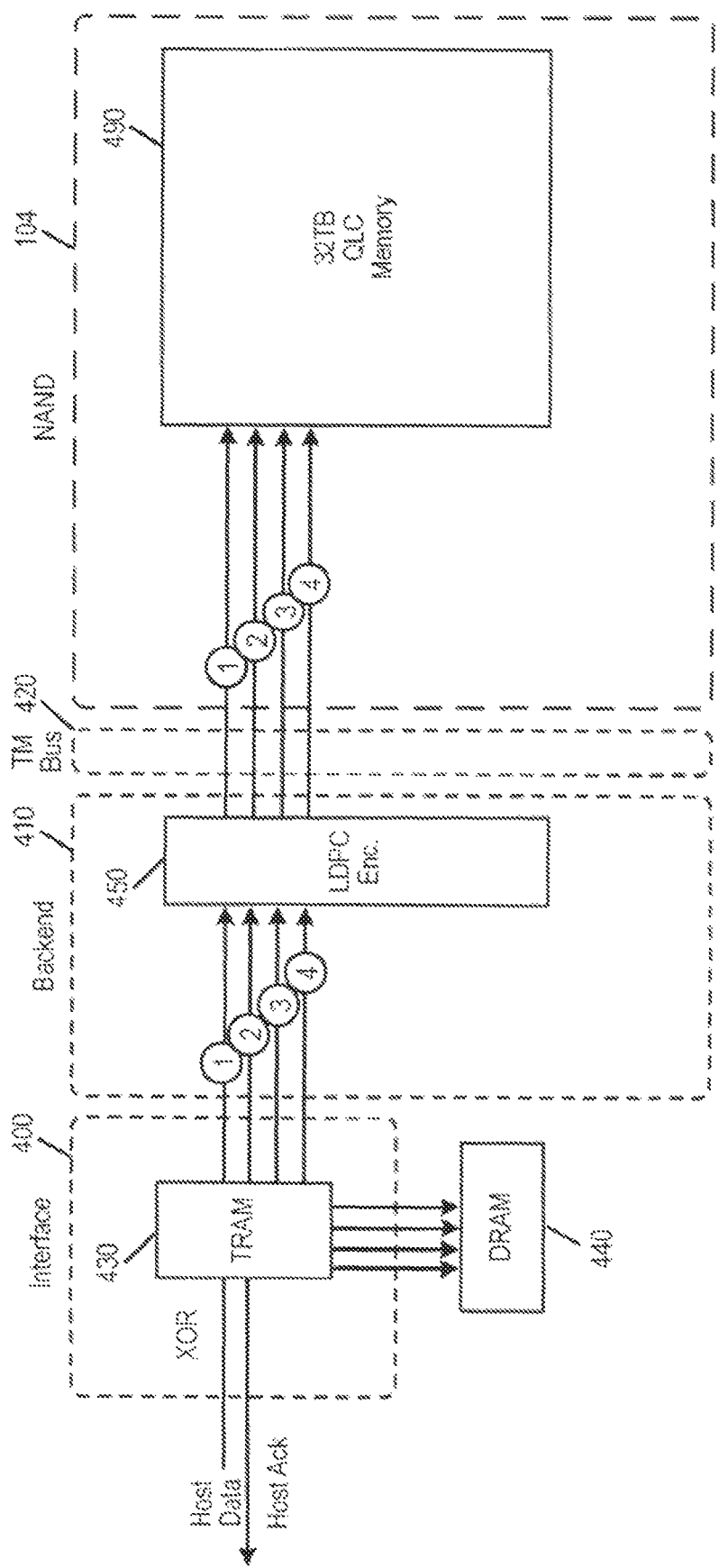
FIG. 5 is a block diagram of a storage system of an embodiment showing another data path.

As shown in FIG. 5, the data path in one implementation of these embodiments can be much simpler that the data path shown in FIG. 4 in that the host data is written to QLC memory directly (Data Paths 1-4), and the data from the DRAM 440 can be evicted right after the data is sent to the memory 104. In these embodiments, a command (sometimes referred to herein as a "PLP signal," "PLP command," "Pfail," or "graceful shutdown (or termination)" command) is provided by the controller 102 to the memory 104 for graceful termination of an on-going MLC program operation. Upon receiving such a command, the memory 104 stops the program operation without corrupting the state of the NAND data latches. The memory 104 can complete the on-going (in-progress) program/verify loop and the related scan operations before bringing the NAND to an idle state.

The following paragraphs provide three techniques to protect the host data in case of a power loss event, and these techniques can be adopted for storage systems with different sizes of PLP capacitors. In these examples, a data reconstruction method is provided for QLC memory. It should be understood that these methods can be extended to other types of memory, such as, MLC memories. The term "MLC" will be used generically herein to refer to memory cells that can store two or more bits. So, TLC and QLC memory are forms of MLC memory. A memory cell that can store only two bits is also an MLC memory. It should also be noted that techniques other than the three described below can be used, and the details provided below should not be read into the claims unless expressly recited therein.

Figure 6:
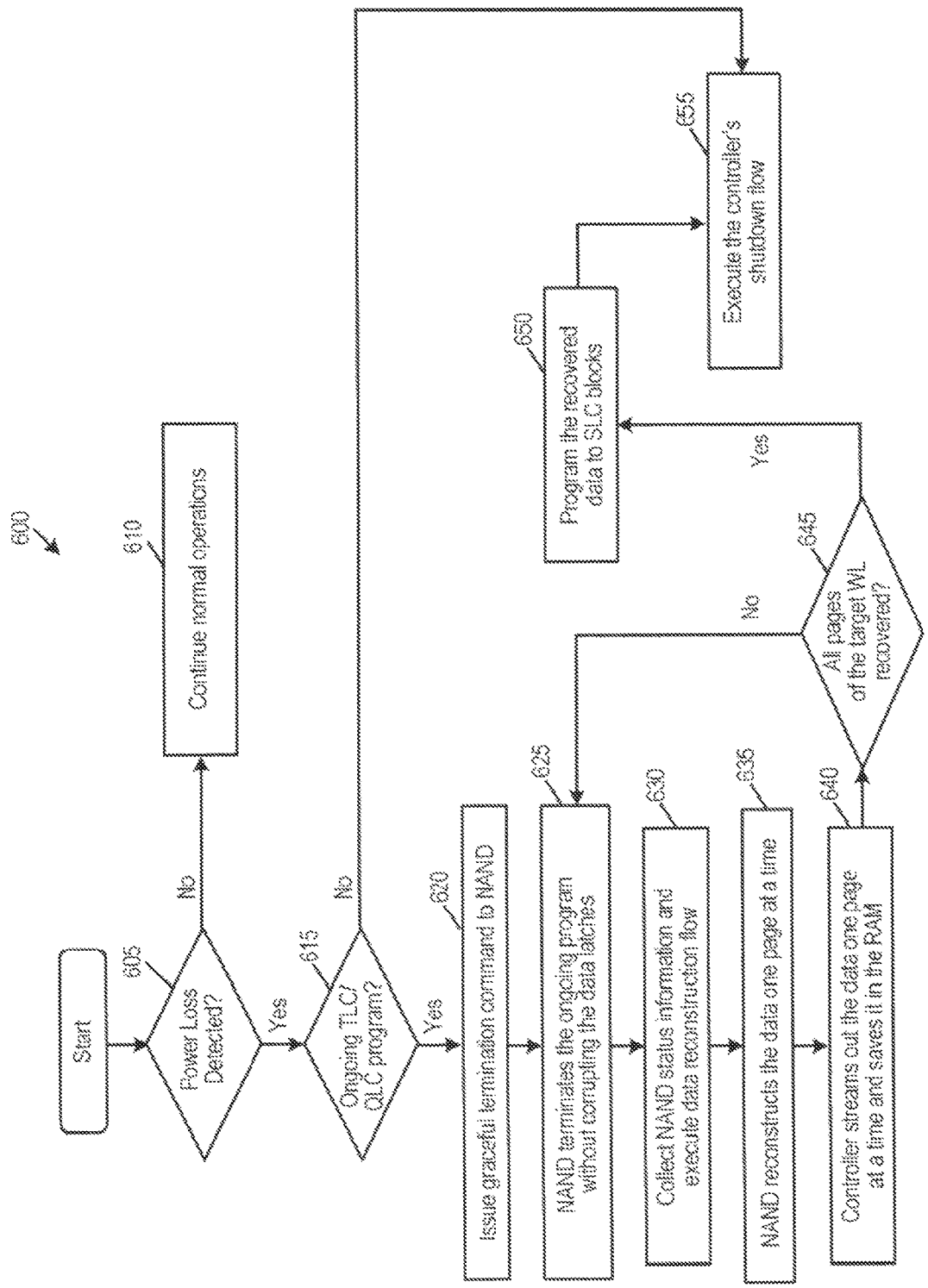
FIG. 6 is a flow chart of a method of an embodiment for data recovery before power down.

In one technique that includes data reconstruction in the latches and programming to SLC memory, upon receipt of the PLP signal, an ongoing program operation is interrupted, and data is reconstructed prior to power down. This technique does not require data transfer to DRAM to be backed-up as in the technique illustrated in FIG. 5. This technique is illustrated in the flow chart 600 in FIG. 6. As shown in FIG. 6, the controller 102 determines if a power loss event is detected (act 605). The controller 102 can determine this in any suitable way. For example, the controller 102 can monitor power coming from the host 300 across the bus/interface connecting the controller 102 to the host 300. As another example, the controller 102 can receive an indication from the host 300 that a power loss in imminent. When power loss occurs, PLP capacitors in the storage system 100 can continue to power the storage system 100, so it can perform the data protection operations described below.

If a power loss is not detected, the controller 102 continues its normal operations (act 610). However, if a power loss is detected, the controller 102 determines if there is an ongoing program operation to MLC (e.g., TLC or QLC) blocks in the memory 104 (act 615). If there isn't an ongoing program operation to the MLC blocks, the controller 102 executes a shutdown flow to shut down the storage system 100 (act 655). This may involve programming some data from SRAM/DRAM to SLC, but not the data in the latches (as there is none). However, if there is an ongoing program operation to MLC blocks, a data loss situation can arise. In programming MLC memory, several programming steps are performed (e.g., foggy-fine programming) to bring a memory cell to the correct state. If the program operation is interrupted prior to completing all of the programming steps, the memory cell will not store the correct state, resulting in data loss. There is no full back-up copy of the data in the latches either during the program.

To prevent such data loss in this embodiment, the controller 102 issues a graceful termination command to the memory 104 (act 620). In response to this command, the memory 104 terminates the ongoing program operation without corrupting the data latches (act 625). That is, the idea here is to finish the programming pulse, read the cells, and update the latches according to the cell's state. If the cell has reached its desired state, then all four bits for the cell will be set to "1'," thus disabling any further program. The data in the latches is not the original data, as the latches only contain data for the cells that are not yet fully programmed. The controller 102 or the memory 104 then collects memory status information and executes a data reconstruction flow (act 530). The collected memory status information specifies which memory cells have been completely programmed and specifies the data in the data latches for those memory cells that have not been completely programmed. Using this collected status information, the memory 104 reconstructs the data latches to contain the data that was to be programmed in the interrupted program operation one page at a time (act 635). The data reconstruction process is discussed in more detail below.

The controller 102 streams the reconstructed data out of the memory 104 one page at a time (in this example, there are four pages of data per wordline) and saves it in volatile memory (e.g., RAM) (act 640). The controller 102 then determines if all the pages of the target wordline have been recovered (act 645). If all the pages have not been recovered, the method loops back to act 625. However, if all the pages have been recovered, the controller 102 programs the recovered data to SLC blocks (which are faster to program that MLC blocks) in the memory 104 (act 650) and shuts the storage system 100 down (act 655).

In another technique, instead of reconstructing the data before shutdown, the storage system 100 saves the information about the interrupted program operation, saves the residual program data from the data latches to SLC blocks in the memory 104, and then powers down. The graceful-shutdown feature (see act 720) may still be used in this case, as some memory cells can be recently programmed but the latches not set to 1111. This discrepancy would result in an error, and too many errors like this may result in an uncorrectable error later. Because the data is not reconstructed prior to power down, the power down process in this technique is faster than in the technique discussed above. The storage system 100 reconstructs the data after power up by combining the residual data saved to the SLC blocks and reading back the subset of data actually programmed to the memory 104. The technique is illustrated in the flow chart 700 in FIG. 7.

Figure 7:
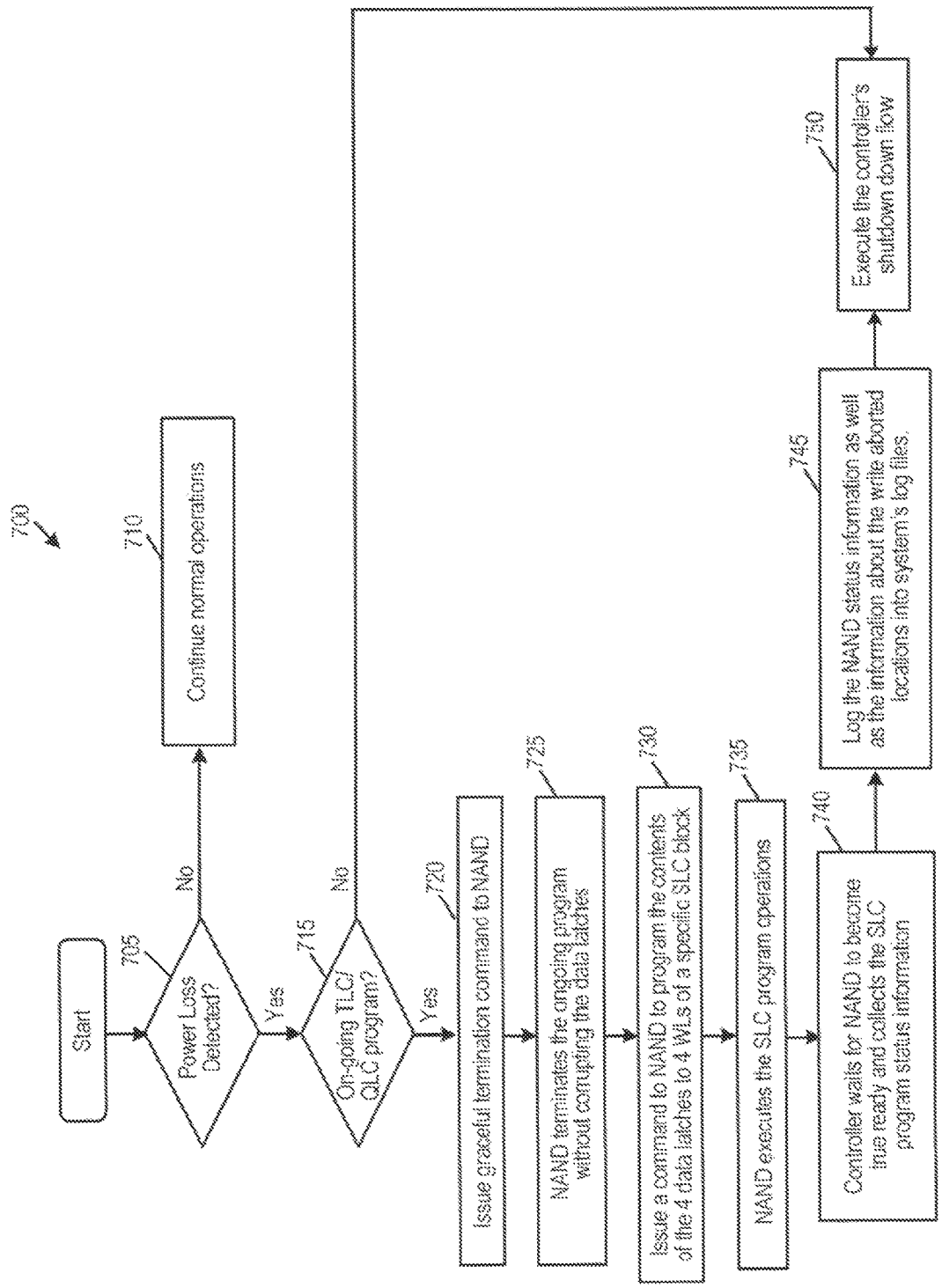
FIG. 7 is a flow chart of a method of an embodiment for data backup before power down.

As shown in FIG. 7, the controller 102 determines if a power loss event is detected (act 705). If a power loss is not detected, the controller 102 continues its normal operations (act 710). However, if a power loss is detected, the controller 102 determines if there is an ongoing program operation to MLC (e.g., TLC or QLC) blocks in the memory 104 (act 715). If there isn't an ongoing program operation to the MLC blocks, the controller 102 executes a shutdown flow to shut down the storage system 100 (act 750). However, if there is an ongoing program operation to MLC blocks, the controller 102 issues a graceful termination command to the memory 104 (act 720). In response to this command, the memory 104 terminates the ongoing program operation without corrupting the data latches (act 725).

Then, the controller 102 issues a command to the memory 104 to program the contents of the four data latches in the memory 104 to four wordlines in a specific SLC block (act 730). The memory 104 then executes the SLC program operations (act 740). The controller 102 waits for the memory 104 to become true ready and collects the SLC program status information (act 740). Then, the controller 102 logs the memory status information, as well as the information about the write-aborted locations, into the storage system's log files (act 745). The controller 102 then executes the shutdown flow to shut down the storage system 100 (act 750).

Figure 8:
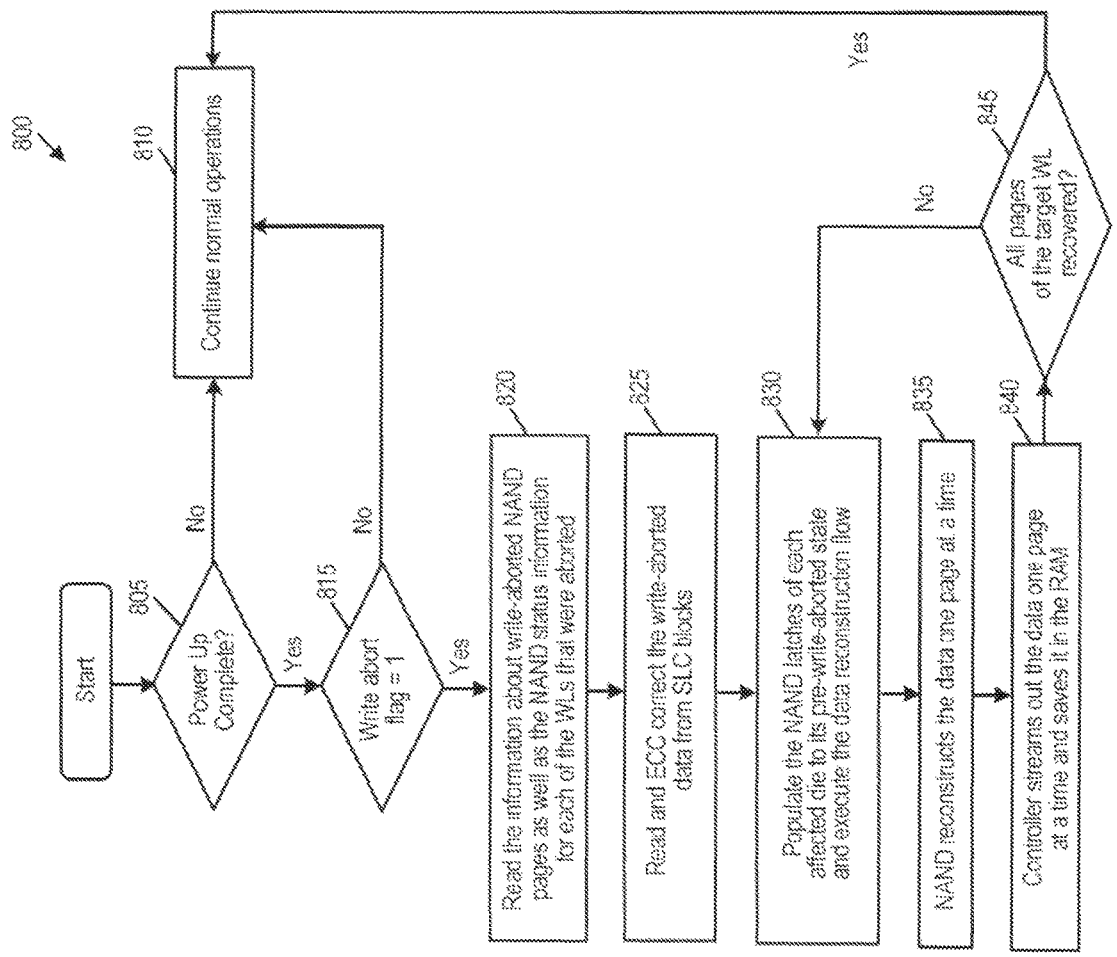
FIG. 8 is a flow chart of a method of an embodiment for data recovery after power up.

FIG. 8 is a flow chart 800 for recovering the data after power up. As shown in FIG. 8, after the storage system 100 powers up, the controller 102 determines if power up is complete (act 805). If power up is not complete, the controller 102 continues with its normal operations (act 810). However, if power up is complete, the controller 102 determines if a write-abort flag is set (e.g., in a register in the controller 102) (act 815). The write-abort flag can be set by the controller 102 if there was a graceful shutdown of the storage system 100. If the write-abort flag is not set, the controller 102 continues with its normal operations (act 810). However, if the write-abort flag is set, the controller 102 reads the information about the write-aborted memory pages, as well as the memory status information, for each of the wordlines that were aborted (act 820). Next, the memory 104 reads and ECC corrects the write-aborted data from the SLC blocks (act 825). The memory 104 then populates the data latches of each affected memory die to its pre-write-aborted state and executes the data reconstruction flow, an example of which is discussed below (act 830). It should be noted that this is not done for the first two methods discussed above: (1) reconstruct then program to SLC and (2) abort, program to SLC, then reconstruct. In (1), the SLC is read (containing full codewords) and corrected to get all the data. The data is then programmed to a normal (not aborted) data block (SLC or QLC) to free the special back-up SLC blocks. In (2), the SLC is read to get partial data (which is not a valid ECC codeword), and the QLC is read to get partial data (which is also not a valid ECC codeword), page by page. Then, reconstruction occurs to make a valid codeword, which can then be corrected and saved.

The memory 104 reconstructs the data one page at a time (act 835), and the controller 102 streams out the data one page at a time and saves it to volatile memory (e.g., RAM) (act 840). The controller 102 then determines if all pages of the target wordline have been recovered (act 845). If all pages of the target wordline have not been recovered, the method loops back to act 830. However, if all pages of the target wordline have been recovered, the data recovery process is complete, and the controller 102 continues its normal operations (act 810).

In the two techniques discussed above, data of an interrupted program operation to a wordline is reconstructed before (the first technique) or after (the second technique) the storage system 100 shuts down. FIGS. 9 and 10 illustrate one way in which the data can be reconstructed. It should be noted that this is merely one example, and other methods can be used.

In this example, when the controller 102 sends the data corresponding to all the pages for a target wordline, the memory 104 first stores it in four data latch sets. For example, for a QLC NAND with a 3255 state code, the state of the four data latches would be as shown in FIG. 9. Each data latch (DL1/2/3/4) contains one page of data, and S0-S15 represent the 16 states of the QLC word-line. After the data transfer from the controller 102 to the memory 104 is complete, the controller 102 issues the program command to the memory 103. The memory 104 may or may not convert the four pages of data into any intermediate state code that can help reduce the scan logic and area before executing the program operation.

During the program operation, the memory 104 executes a program subroutine and a verify subroutine during each loop of that operation. During the verify operation, the memory 104 senses the data of the target wordline and flips (to a value "1") the data latches of the memory cells that have reached their target Vt state. This process of program-and-verify is repeated multiple times until either all the data latches have flipped to "1" or until the maximum allowed loop count has been reached. If the controller 102 issues the "graceful stop" command to the memory 104 while a programming operation is in progress, the memory 104 will complete execution of the ongoing program loop and then terminate the state machine before going to the idle state. FIG. 10 shows the contents of the data latches after the "graceful stop" operation.

Figure 11:
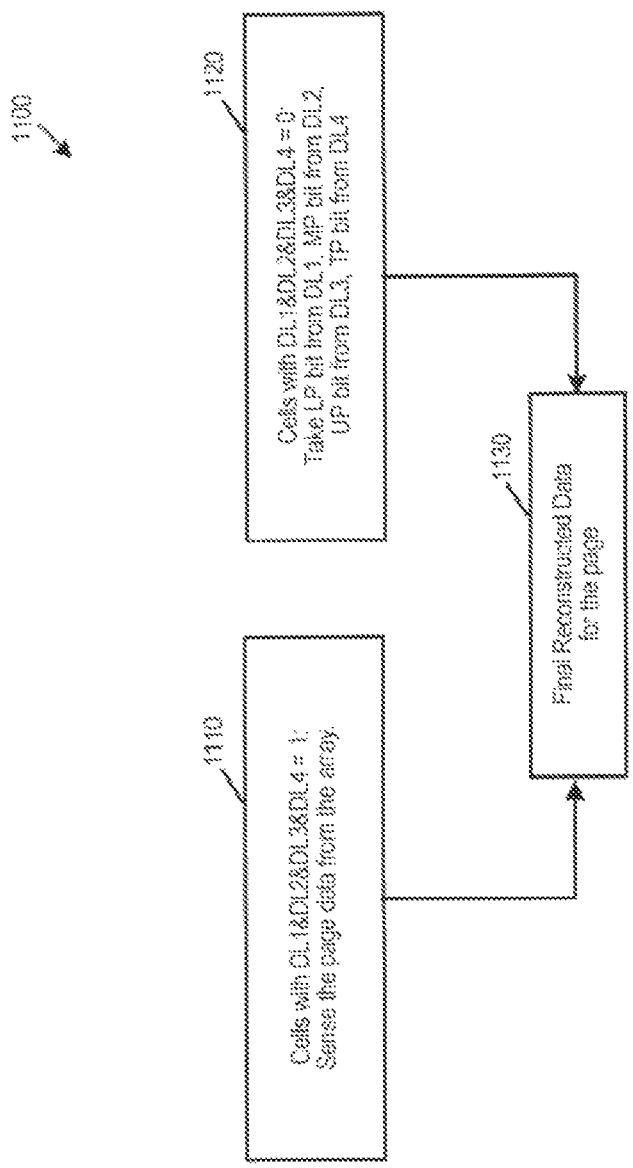
FIG. 11 is a flow chart of a data reconstruction method of an embodiment.

When the data reconstruction is desired, the storage system 100 will reconstruct all four pages of data, one page at a time. FIG. 11 is a flow chart 1100 of an example reconstruction method of an embodiment (other methods can be used). As shown in FIG. 11, the memory 104 senses the page data from cells that have been successfully programmed (act 1110). For those cells that have not been successfully programmed, the memory 104 takes the lower-page bit from DL1, the middle-page bit from DL2, the upper page bit form DL3, and the top-page bit from DL4 (act 1120). The information from both of these acts is then combined to generate the final reconstructed data for the page (act 1130). It should be noted that both parts of the data before the reconstruction are not codewords, so any error in those parts cannot be corrected.

The reconstruction method can be implemented in the memory 104 or in the controller 102 (e.g., in firmware). In the latter situation, the controller 102 can stream out the content of all the data latches into volatile memory (e.g., system RAM) first and then execute sense operations of S1 to S15 to reconstruct the data. This concept can be applied to a programming operation with one-bit per cell, two-bits per cell, three-bits per cell, etc. Also, this reconstruction concept can be extended to cover cache programming, where a subset of data latches may hold the data for the next programming operation. Right before the first, second, and third data latches are released, the memory 104 can internally allocate a three-bit, two-bit, or one-bit coding, respectively, to the Vt states that are yet to complete programming. In such a case, the controller 102 can collect the information about the memory's cache release status immediately after the graceful termination command is executed.

Depending upon the memory status, the controller 102 can execute one of the following flows. If the memory status indicates no cache was released, a four-page reconstruction flow is performed. If the memory status indicates the first cache was released, one page of cached data of the next wordline is recovered from DL4, and a three-bits-per-cell reconstruction flow is performed. If the memory status indicates the second cache was released, two pages of cached data of the next wordline are recovered from DL4 and DL3, and a two-bits-per-cell reconstruction flow is performed. If the memory status indicates the third cache was released, three pages of cached data of the next wordline are recovered from DL4/3/2, and a one-page reconstruction flow is performed.

The following paragraphs present another technique for data protection during power loss. By way of review, the two techniques discussed above involved a command from the controller 102 to the memory 104 for a graceful shutdown, resulting in an abort of an ongoing fine programming operation (after finishing the verify or program pulse) and updating the data latches as per the results of the read-and-verify operation. The recovery here is similar to the method discussed above where the data gets reconstructed after power up, with ECC correction after reconstruction. In the first technique, the memory 104 responded to the command by reading data from the programmed memory cell in the QLC memory immediately, storing that data in the corresponding data latches, reconstructing the fine data using the unprogrammed memory cells' data already present in the data latches, and programming the reconstructed page in the SLC memory. In the second technique, the memory 104 responded to the command by flushing the data in the data latches to SLC memory, reading the programmed data from the QLC memory into the data latches, and then flushing that data to the SLC memory, all without DRAM transfers. The fine data is reconstructed when the storage system 100 later powers up. In the third technique described below, the memory 104 responds to the command by programming the data in the latches to the SLC memory. At power up, the storage system 100 reads the QLC memory and reconstructs the data.

It should be noted that these techniques can be used in an MLC-fine case, as well as a foggy-phase abort case, and additional steps may be required for an encoded foggy-fine situation. More specifically, fine-phase recovery in the foggy-fine program mode operates as discussed above. In the MLC-fine programming mode, if MLC pages are already protected (in SLC) or can be saved in response to the graceful shutdown command (to SLC), then only the upper and top pages need to be recovered. In the encoded foggy-fine mode, the first and third data protection techniques can be used without parity, but parity can be used to allow more errors to be fixed. Additionally, the parity page can be used to recover the fine phase data (the same way as using foggy data, aborted fine can be more reliable than normal foggy). Power loss in the fine phase, which is usually the longer phase, may be the main problem.

Figure 12:
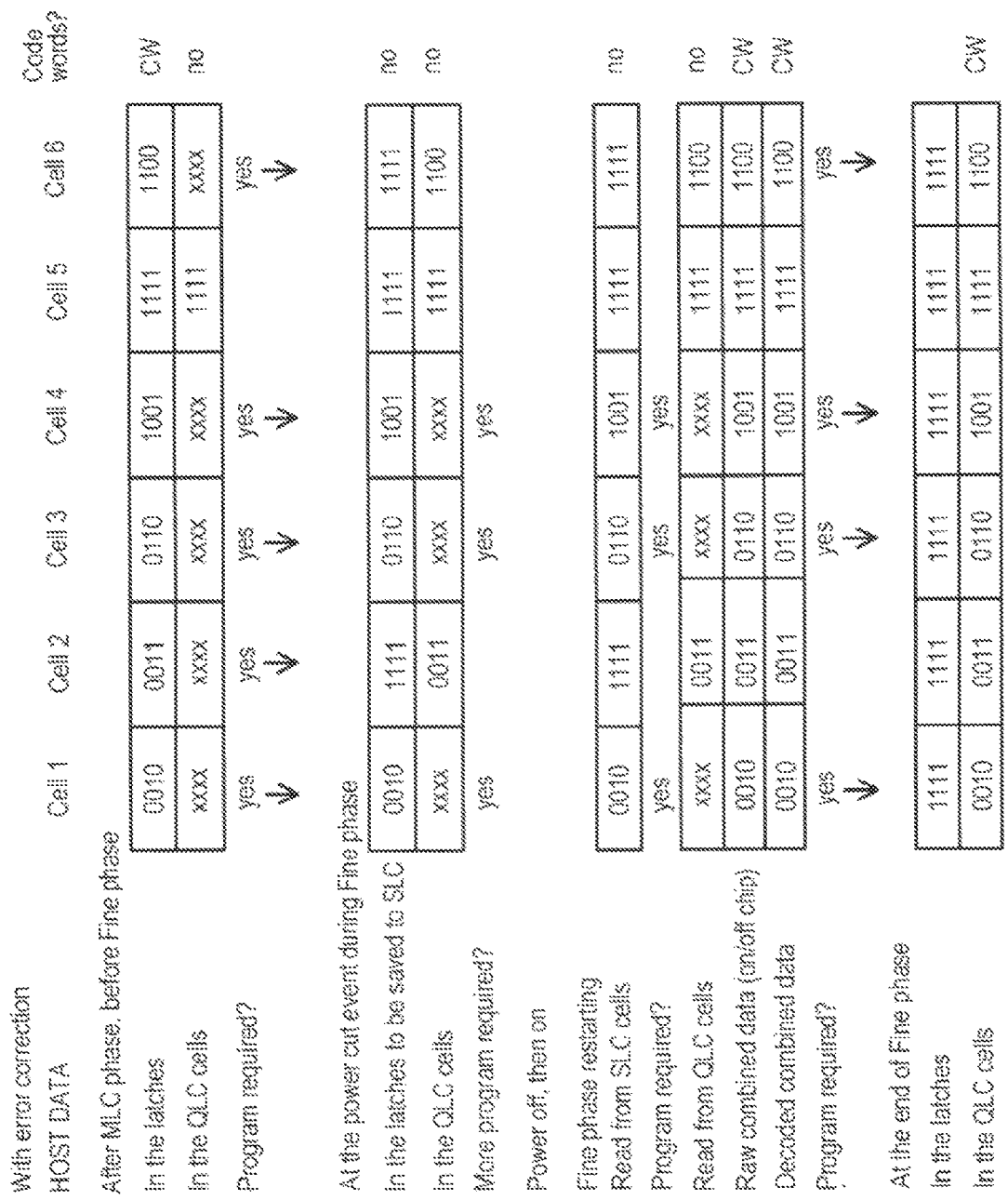
FIG. 12 is a chart illustrating a method of an embodiment for data protection during power loss.

Turning again to the drawings, FIG. 12 illustrates the third technique mentioned above for a fine programming operation with error correction. In this technique, in case of a power loss event during the fine programming phase, the memory 104 saves the data from the latches to the SLC block in the memory 104 (e.g., on the same die). When power is resumed, the memory 140 programs the data from the SLC block to the aborted wordline. The original data is then reconstructed in the latches. More specifically, if SLC=1111, data is taken from the QLC memory; otherwise, data is taken from the SLC memory. The data is the raw error correction code (ECC) codeword plus errors from the SLC and QLC memory. After the ECC errors are fixed, the original codeword is reconstructed. The data is then set to 1111 for the programmed cells, if necessary, and the aborted wordline is programmed. Reconstruction can be done off-chip or on-chip, which may involve the use of a fifth data latch and possibly test modes. The technique has the advantage of not needing to back-up data to volatile memory (DRAM), enabling an on-chip MLC read with extra error propagation risks and ECC protection at the possible cost of extra complexity in reconstructing the original data.

When power is back on, the storage system 100 reconstructs the original data in the latches. In this example, the four saved pages are read from the SLC memory and stored in the data latches. If the bits equal 1111 in all four pages (e.g., uLP&uMP& uUP&uTP=1), where the "u" is an unprogrammed data page, the data is taken from the QLC memory (because it was successfully programmed there prior to shut down). Otherwise, the data is read from the SLC memory. As shown in the chart in FIG. 13, in one example implementation, a Programmed Flag is used to indicate programming status. Here, the Programmed Flag=LP&MP&UP&TP, where "1" means no extra program is necessary (i.e., data in QLC wordline can be used for this bit), and 0 means that the QLC wordline data should be ignored, as the SLC wordline contains the correct data.

Then, page by page (for the lower page), a combined page can be generated as ((Not PF) AND (uLP)) OR ((PF) AND (QLC LP), as indicated in the table in FIG. 13. In order to do this on-chip, this operation can be broken down into steps to use the existing data latches (e.g., 3 or 4 latches). The recovered LP data is now raw ECC codewords containing errors from the SLC and QLC memory. The ECC errors are then fixed, and the original codewords are reconstructed. Then, the data is set to 1111 for the programmed cells, if necessary, and the data is programmed to the aborted wordline.

Figure 14:
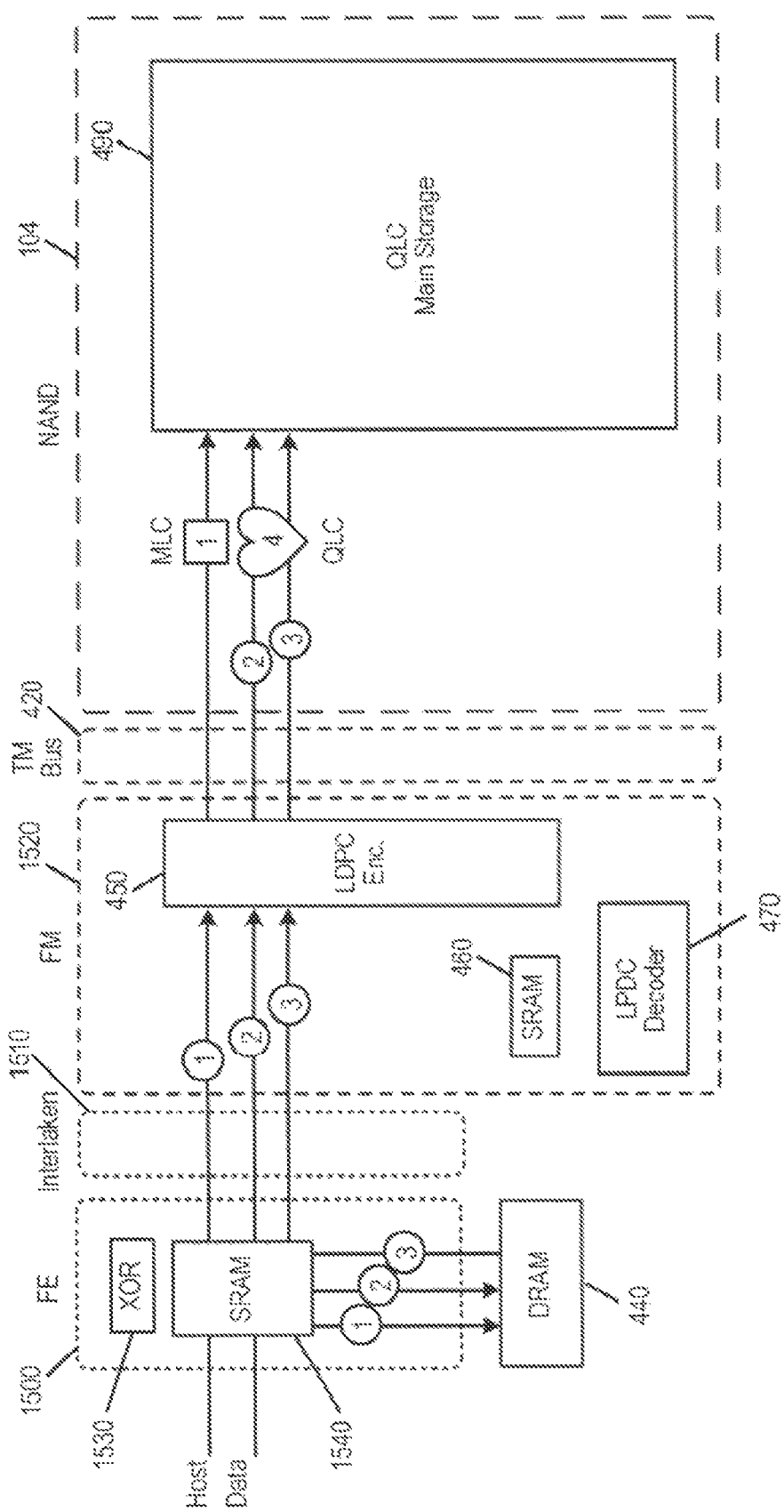
FIG. 14 is a block diagram illustrating a fine programming data path in a storage system of an embodiment.

FIG. 14 is a block diagram illustrating an MLC-fine programming data path of an embodiment. As shown in FIG. 14, the storage system 100 in this embodiment comprises components already mentioned above. In addition, the storage system 100 comprises a front-end (FE) module 1500 with an XOR module 1530 and SRAM 1540, an interlaken module 1510, and a firmware (FM) module. In Data Path 1, the storage system 100 performs a two-page host write, with stage-two pages in DRAM 440, and programs in MLC mode. In Data Path 2, the storage system 100 performs a two-page host write, with stage-two pages in DRAM 440, and two pages transferred to the data latches. In Data Path 3, two MLC pages are transferred from the DRAM 440 to the data latches. It should be noted that data need only be written to DRAM if MLC data is used for the MLC-Fine phase. In the MLC-Fine phase, the controller 102 programs two pages of data in the MLC mode first and then adds two more pages of data and programs in the Fine mode. All four pages of data are needed in the latches to start the Fine programming. The existing two pages (MLC) can be either sent from the controller 102 if it has a copy in DRAM or SRAM or can be read from the wordline in MLC mode, which case a copy is not needed in DRAM or SRAM. There is an alternative of reading MLC data on-chip, in which case, the DRAM stage and re-transferring MLC data to the NAND the second time (line (3) would not be needed. Finally, in Data Path 4, data is programming in the QLC memory 490 in fine mode.

As mentioned above, while the previous example was discussed in terms of a write abort during fine programming mode, foggy-phase abort solutions can also be used. These solutions can be applicable to encoded foggy-fine programming if an extra parity bit is needed. The same sequence can be used as discussed above for the fine phase recovery with the following additional steps: programmed cells' data are read from QLC, foggy levels (if the third technique is used)

from SLC memory are used, unprogrammed cells' data is read from the SLC, the data is combined as discussed above, the parity page is read out and corrected, the parity is used to modify the foggy data to fine data, which becomes ECC codewords, and the fine data is corrected.

Figure 15:
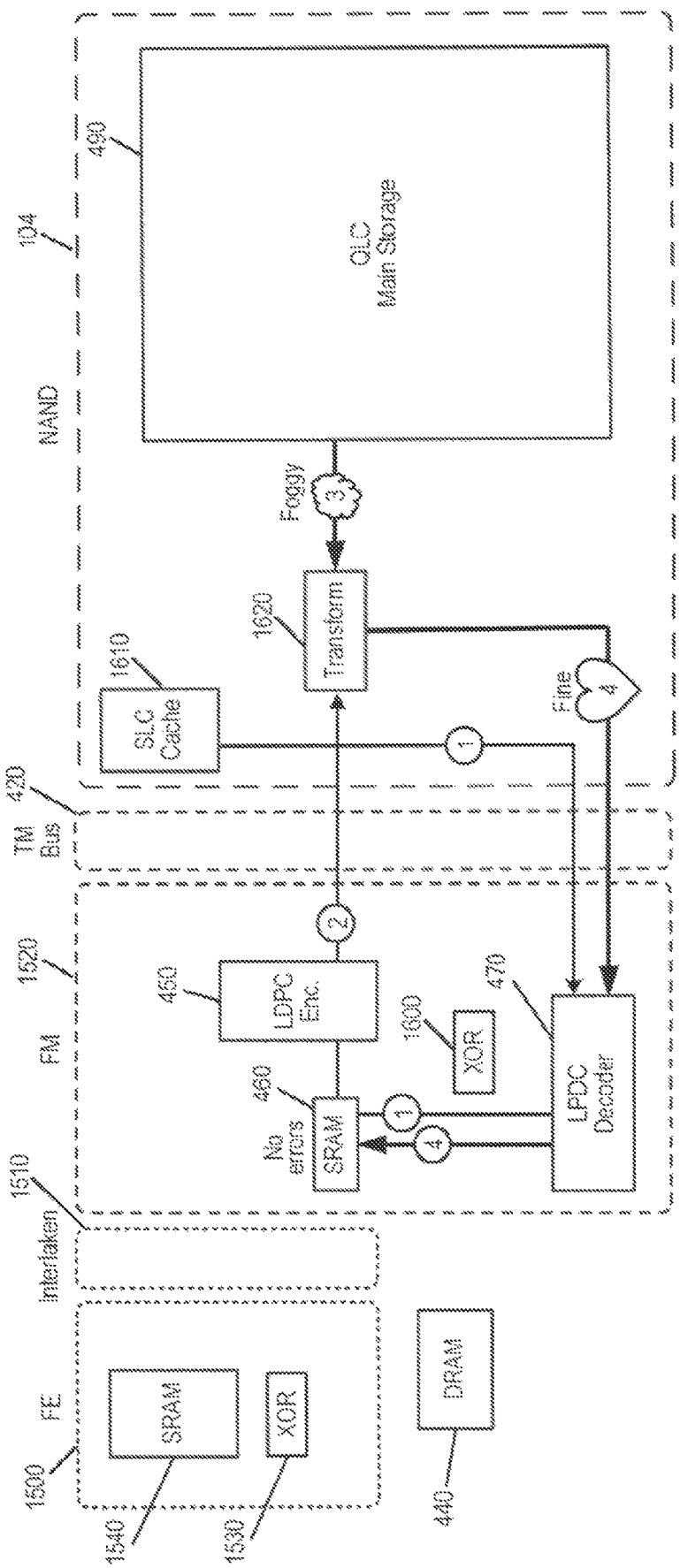
FIG. 15 is a block diagram illustrating a data path for reading a foggy wordline in a storage system of an embodiment.

FIG. 15 illustrates possible data paths for reading foggy wordlines (e.g., after bake). Here, the foggy data is not a codeword, and ECC correction can be done after the transformation to fine data. The foggy-fine method is based on foggy being not a valid codeword in all cases, as about 50% of the cells are in the wrong state (one state below the target) after the foggy phase. As shown in FIG. 15, in Data Path 1, data is read from the SLC cache 1610, processed by the LPDC encoder 470, and stored in SRAM 460. This is data reconstruction for the encoded foggy-fine method only. In the encoded foggy-fine method, data may be encoded prior to being foggy programmed (e.g., by generating parity data), so that when a read of foggy-programmed memory cells (in first distributions) is performed, the results of that read (a foggy read) may be decoded (e.g., combined with parity data) to recover the original data. On-chip circuits may be provided to perform such encoding (e.g., XOR circuits) and decoding, so that resources are efficiently used, and excessive transfer of data (e.g., through the memory bus) is avoided. Parity data may be stored on-chip in some cases (e.g., in a portion of a non-volatile memory structure that is configured for SLC storage). In some cases, parity data may be corrected (decoded) by ECC circuits prior to being used for recovery of data. Parity data may also be stored off-chip (e.g., in DRAM).

In Data Path 2, the data is read from the SRAM 460, processed by the LDPC encoder 450, and then sent to the transform module 1620. In Data Path 3, foggy data is read from the QLC memory 490 and sent to the transform module 1620. In Data Path 4, the transformed fine data is sent to the LDPC decoder 470, and the decoded data is stored in the SRAM 460.

Figure 16:
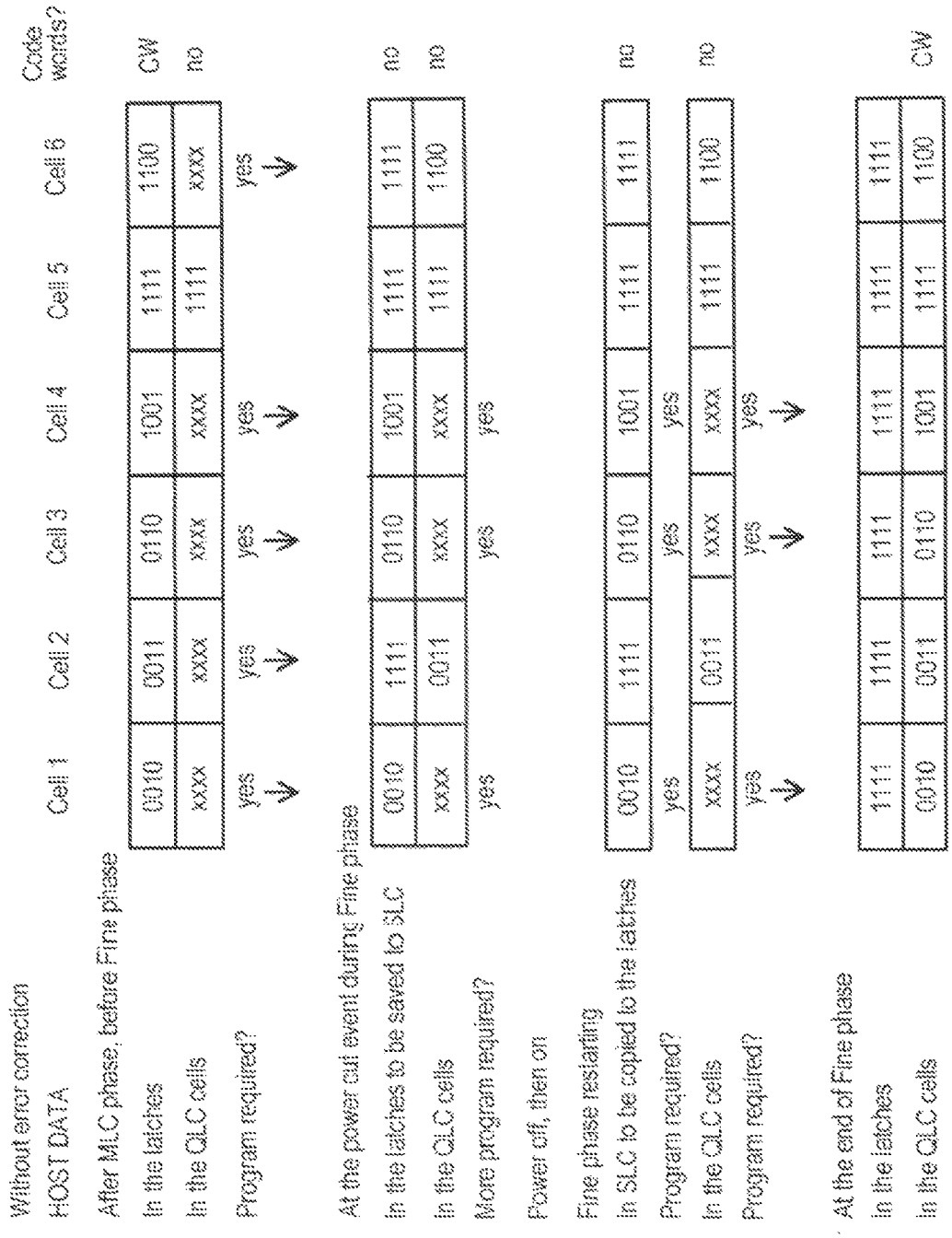
FIG. 16 is a chart illustrating a method of an embodiment for data protection during power loss.

Turning again to the drawings, FIG. 16 is a chart illustrating a MLC-fine on-chip Pfail scram without error correction. In this embodiment, in case of a power loss event during the fine phase, data from the latches is saved to the SLC block on the same die. When power is on again, the data is read from the SLC block and programmed to the aborted wordline as-is without error correction. This provides the advantage of not needing to back up data in the DRAM and enabling on-chip MLC read with its own error propagation risks. However, the SLC data and the aborted fine data are not ECC protected, and the combined SLC and aborted fine data cannot be corrected after program. So, with these embodiments, the data recovery scheme that is used can be chosen based on the error rate.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
    a memory comprising data latches and a non-volatile memory array comprising single-level cell (SLC) memory and multi-level cell (MLC) memory; and
    a controller configured to send a command to the memory in response to detection of power loss;
    wherein in response to receiving the command, the memory is configured to abort an ongoing programming operation to program data, from the data latches, in the MLC memory, wherein after aborting the ongoing programming operation, some, but not all, memory cells in the MLC memory are successfully programmed; and
    wherein the controller is further configured to:
        store, in the SLC memory prior to powering down the storage system, data from the data latches that correspond to memory cells in the MLC memory that were not successfully programmed;
        after powering up the storage system, reconstruct the data that was to be programmed in the MLC memory from the data stored in the SLC memory and from the memory cells in the MLC memory that were successfully programmed.

2. The storage system of claim 1, wherein the controller is further configured to, after powering up the storage system, cause the data to be read from the SLC memory.

3. The storage system of claim 1, wherein the ongoing programming operation is aborted without corrupting the data latches.

4. The storage system of claim 1, wherein the memory is further configured to reconstruct the data one page at a time.

5. The storage system of claim 1, wherein the controller is further configured to determine that a memory cell in the MLC memory was successfully programmed in response to determining its corresponding data latch indicates successful programming.

6. The storage system of claim 1, wherein the controller is further configured to power down the storage system after storing the data in the SLC memory.

7. The storage system of claim 1, further comprising a capacitor configured to power the storage system for shutdown operations in an absence of power from a host.

8. The storage system of claim 1, wherein the memory comprises a three-dimensional memory.

9. In a storage system comprising a controller and a memory comprising data latches and a non-volatile memory array comprising single-level cell (SLC) memory and multi-level cell (MLC) memory, a method comprising:
    sending a command from the controller to the memory in response to detection of power loss;
    in response to the memory receiving the command, aborting an ongoing programming operation to program data, from the data latches, in the MLC memory, wherein after aborting the ongoing programming operation, some, but not all, memory cells in the MLC memory are successfully programmed; and
    prior to powering down the storage system, programming, in the SLC memory, data from the data latches that correspond to memory cells in the MLC memory that were not successfully programmed; and
    after powering up the storage system, reconstructing the data that was to be programmed in the MLC memory from the data stored in the SLC memory and from the memory cells in the MLC memory that were successfully programmed.

10. The method of claim 9, further comprising, after powering up the storage system:
    programming the reconstructed data in the MLC memory.

11. The method of claim 10, further comprising error correcting the data read from the SLC memory.

12. The method of claim 9, wherein the ongoing programming operation is aborted without corrupting the data latches.

13. The method of claim 9, further comprising determining that a memory cell in the MLC memory was successfully programmed in response to determining its corresponding data latch indicates successful programming.

14. The method of claim 9, further comprising powering down the storage system after programming the SLC memory.

15. The method of claim 9, further comprising logging memory status information and information about write-aborted locations in the MLC memory.

16. A storage system comprising:
- a memory comprising data latches and a non-volatile memory array comprising single-level cell (SLC) memory and multi-level cell (MLC) memory;
- means for, in response to receiving a command generated in response to detection of power loss, aborting an ongoing programming operation to program data, from the data latches, in the MLC memory, wherein after aborting the ongoing programming operation, some, but not all, memory cells in the MLC memory are successfully programmed;
- means for storing, in the SLC memory prior to powering down the storage system, data from the data latches that correspond to memory cells in the MLC memory that were not successfully programmed; and
- means for, after powering up the storage system, reconstructing the data that was to be programmed in the MLC memory from the data stored in the SLC memory and from the memory cells in the MLC memory that were successfully programmed.

17. The storage system of claim 16, further comprising:
- means for programming the reconstructed data in the MLC memory.

18. The storage system of claim 16, further comprising:
- means for error correcting the data read from the SLC memory.

19. The storage system of claim 16, further comprising a capacitor configured to power the storage system for shutdown operations in an absence of power from a host.

\* \* \* \* \*